United States Patent [19]
Blackburn et al.

[11] 3,766,414
[45] Oct. 16, 1973

[54] TECHNIQUE FOR DERIVING A REGULATED D-C SOURCE FOR LOW-LEVEL LOGIC CIRCUITS FROM A HIGH D-C VOLTAGE SOURCE

[75] Inventors: Tom L. Blackburn, San Jose; Otto G. Wisotzky, San Francisco, both of Calif.

[73] Assignee: GTE Automatic Electric Laboratories Incorporated, Northlake, Ill.

[22] Filed: Feb. 16, 1972

[21] Appl. No.: 226,747

[52] U.S. Cl. .................. 307/297, 307/235, 307/254, 307/296

[51] Int. Cl. .......................................... H03k 17/00

[58] Field of Search .................... 307/296, 297, 318, 307/235, 290, 293

[56] References Cited

UNITED STATES PATENTS

| | | | |
|---|---|---|---|
| 3,374,365 | 3/1968 | Lyles et al. | 307/235 |
| 3,435,257 | 3/1969 | Lawrie | 307/235 |
| 3,130,326 | 4/1964 | Habisohn | 307/235 |
| 3,344,308 | 9/1967 | Atkinson | 307/235 |
| 3,388,293 | 6/1968 | Petschauer | 307/296 |
| 3,091,705 | 5/1963 | Levine | 307/293 |

OTHER PUBLICATIONS

Field-Effect Devices Enjoy Wider Markets, New Uses, Electronic Design, 8/16/65 pg. 16.

*Primary Examiner*—John W. Huckert
*Assistant Examiner*—B. P. Davis
*Attorney*—K. Mullerheim et al.

[57] ABSTRACT

A Zener diode, a voltage dropping resistor, and a first transistor are connected in series across a primary d-c source. The emitter-collector junction is in the series path of the diode and resistor. A second transistor has one side of its emitter-collector junction connected to the junction of the Zener diode and resistor, and the other side connected both to the base of the first transistor and to one side of the load. The other side of the load is connected to one side of said source. A control signal applied to the base of the second transistor turns the transistor on or off. When the second transistor is turned off, the first transistor is turned on and the voltage dropping resistor is in the circuit. When the second transistor is on, the first transistor is turned off and the load replaces the voltage dropping resistor in the regulation circuit.

4 Claims, 1 Drawing Figure

PATENTED OCT 16 1973 3,766,414
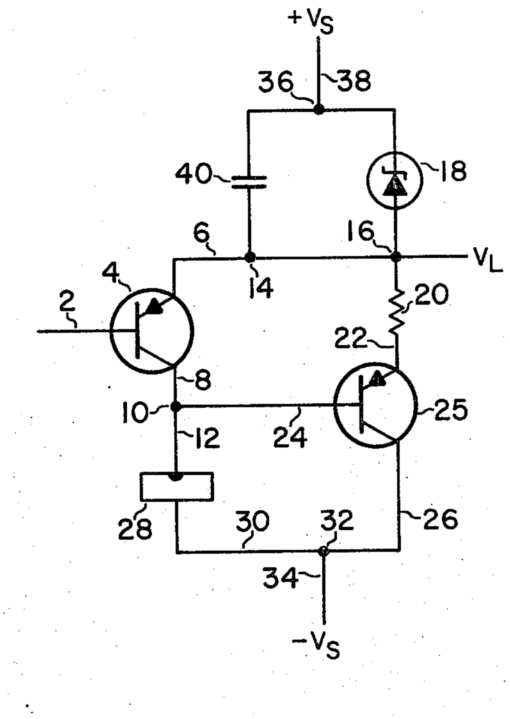

TECHNIQUE FOR DERIVING A REGULATED D-C SOURCE FOR LOW-LEVEL LOGIC CIRCUITS FROM A HIGH D-C VOLTAGE SOURCE

BACKGROUND OF THE INVENTION

1. Field of the Invention

This invention relates to regulation of relatively low d-c voltages for low-level logic circuits and in particular to control circuits that derive the low d-c voltage from a primary source that has a d-c voltage output that is considerably greater than that required by the low-level logic circuitry.

2. Description of the prior art

The introduction of low-level logic circuitry offered the advantage that power dissipation could be substantially reduced thus permitting a higher density of packaging of circuit components. Where only low-level logic circuits would be used, power sources were derived and supplied the necessary power at the desired voltage and level. However, there are many applications in which low-level logic circuitry is compatibly married with standard components, such as telephone type relays. Further, the primary source of d-c in such applications is most often the central office battery in a telephone exchange. This primary voltage source is much higher in voltage than that needed to operate the logic circuits and must be reduced.

A common technique used for deriving the desired low-level logic voltage is to employ a Zener diode and a voltage dropping resistor across the source. The Zener diode is selected so that the voltage drop across the diode is equal to that desired for the low-level logic circuitry. The resistor is selected to provide the necessary voltage drop for the normal operating current of the Zener diode. The power developed in the dropping resistor is thus wasted. Further, the primary source or the voltage difference between the source potential and the Zener voltage may be used to provide other functions. As hereinabove noted, this difference voltage may be used to operate a relay, for example. In known prior-art devices, this voltage was supplied to the other functional devices without changing the basic low-level voltage regulation circuit arrangement. Thus, there is power dissipated in the voltage dropping resistor as well as the power dissipated in the functional devices. Not only is this wasteful of energy but such dissipation of power adversely affects the desired miniaturization techniques which otherwise are permissible because of the temperature rise problems attendant with the added heat dissipation.

SUMMARY OF THE INVENTION

According to the invention a Zener diode, a voltage dropping resistor, and a first transistor are connected in a series arrangement which is, in turn, connected across the primary d-c power source. A second transistor is connected between the junction of the Zener diode and the voltage dropping resistor and one side of a load. The other side of the load is connected to the side of the first transistor that is connected to one side of the primary source. The two transistors are arranged to switch between the voltage dropping resistor and the load in response to a control signal. The control signal is applied to the base of the second transistor, and this transistor is turned on when the load circuit is to be energized. Turning the second transistor on turns off the first transistor because of the change in base bias, and the voltage dropping resistor is thus switched out of the circuit.

A capacitor is connected across the Zener diode to stabilize the voltage during switching. Switching transients, even with inductive loads, are minimized because of the diode action of the base-emitter junction of the first transistor.

BRIEF DESCRIPTION OF THE DRAWING

A schematic diagram of one technique for implementing the invention is shown in the accompanying drawing.

DESCRIPTION OF THE PREFERRED EMBODIMENT

Referring now to the FIGURE in the accompanying drawing, the power regulation circuitry derives its power from a primary source of either regulated or unregulated voltage which is designated $+V_s$ and $-V_s$ in the FIGURE. It should be noted that polarities have been chosen to illustrate the circuit configuration with one transistor type; however, other polarities could be used with other transistor configurations, and this in no way is restrictive of the application of the invention. In many applications, one side or the other of the primary power source would be grounded, and in the present example the $+V_s$ is considered to be ground and therefore the transistors and the Zener diodes illustrated in the FIGURE are arranged for a negative primary voltage supply source. These could be reversed in polarity for use with a positive voltage source.

A bias control signal is applied via lead 2 to the base of transistor 4. This control signal is responsive to equipment information that determines whether or not the load 28 is to be connected to the source. Load 28 is illustrated as a relay but it could be any normal load device which would be switched in or out of the circuit, depending upon the requirements of the equipment units. When the base of transistor 4 is biased such that the base-emitter junction is reverse biased, then transistor 4 is nonconducting. In this state, load 28 is not energized. The resistance of load 28 is arranged to provide a current path for the base of transistor 25. This current path with load 28 not energized provides the proper bias for transistors 25 to turn on this transistor and keep it in saturation. Under these conditions, there is a circuit path from $+V_s$, lead 38, junction 36, Zener diode 18, junction 16, voltage dropping resistor 20, transistor 25, lead 26, junction 32, and lead 34 to $-V_s$. This path provides the regulated low-voltage output required for the low-level logic circuits from the output lead extending from junction 16, voltage $V_L$.

When transistor 4 turns on because of the change in bias applied control lead input 2, the collector 8 of transistor 4 is at a voltage which is approximately equal to $V_L$, which in turn reverse biases the emitter-base junction of transistor 25, thus turning it off. The current which was previously flowing in voltage dropping resistor 20 now flows in transistor 4 and load 28 which energizes the relay. The resistance of voltage-dropping resistor 20 is chosen to be approximately equal to the resistance of load 28 such that the current in Zener diode 18 remains approximately the same in either state of operation. Capacitor 40, which is connected between junction 36 and junction 14 across Zener diode 18, holds the output voltage constant when the circuit is switching between the two states of operation.

What is claimed is:

1. Apparatus for supplying a regulated and reduced voltage output from a primary d-c source and for minimizing power dissipation derived from said primary source comprising:

a control means;

a voltage dropping means;

means for providing a regulated and reduced voltage output from said primary d-c source, said means being operatively connected between said voltage dropping means and said source;

a load having an input and an output, said load being operative from the voltage level of said voltage dropping means; and, switching means operatively connected to said voltage dropping means and said load, said switching means interchanging the connection of said voltage dropping means and said load in response to the control means.

2. Apparatus in accordance with claim 1 in which said voltage dropping means is a resistor.

3. Apparatus in accordance with claim 2 in which said means for providing a regulated and reduced voltage output is a Zener diode.

4. Apparatus in accordance with claim 3 in which said switching means further comprises:

a first transistor having its emitter-collector junction connected between one side of said voltage dropping resistor and said primary d-c source, and the base connected to one side of said load;

a second transistor having its emitter-collector junction connected between the Zener diode-resistor junction and one side of said load, and the base connected to said control means.

* * * * *